United States Patent [19]

Bartenstein et al.

[11] Patent Number: 4,870,369

[45] Date of Patent: Sep. 26, 1989

[54] CIRCUIT ARRANGEMENT HAVING A PRE-AMPLIFIER CONNECTED TO AN OPTO-ELECTRIC TRANSDUCER

[75] Inventors: Peter Bartenstein, Munich; Karl-Heinz Prasse, Mittenwald, both of Fed. Rep. of Germany

[73] Assignee: Siemens Aktiengesellschaft, Munich, Fed. Rep. of Germany

[21] Appl. No.: 259,534

[22] Filed: Oct. 18, 1988

[30] Foreign Application Priority Data

Oct. 26, 1987 [DE] Fed. Rep. of Germany ....... 3736181

[51] Int. Cl.$^4$ .......................... H03G 3/30; H01J 40/14
[52] U.S. Cl. ...................... 330/59; 330/133; 330/134; 330/282; 330/308; 250/214 A; 250/214 AG
[58] Field of Search ................... 330/59, 86, 133, 134, 330/282, 308; 455/619; 250/214 A, 214 AG

[56] References Cited

U.S. PATENT DOCUMENTS

| | | | |
|---|---|---|---|
| 4,053,847 | 10/1977 | Kumahara et al. | 330/277 |
| 4,459,475 | 7/1984 | Flint et al. | 250/214 AG |
| 4,495,410 | 1/1985 | Minami et al. | 250/214 AG |

FOREIGN PATENT DOCUMENTS

| | | |
|---|---|---|
| 3204839 | 9/1983 | Fed. Rep. of Germany . |
| 3504224 | 8/1986 | Fed. Rep. of Germany . |
| 1592575 | 7/1981 | United Kingdom . |

Primary Examiner—James B. Mullins
Attorney, Agent, or Firm—Hill, Van Santen, Steadman & Simpson

[57] ABSTRACT

A circuit arrangement has a pre-amplifier that has its input connected to an opto-electric transducer and whose gain is controllable by a final control element formed by a field effect transistor. In order to achieve an especially great range of dynamics, the pre-amplifier contains the drain-source path of a field effect transistor that is connected in parallel to a resistor in a feedback branch. This field effect transistor is activated or inhibited by a regulator. In this way, the range of control of a controllable amplifier arrangement following the pre-amplifier is doubly utilized. The circuit arrangement can be advantageously used in optical transmission equipment of PCM technology.

20 Claims, 1 Drawing Sheet

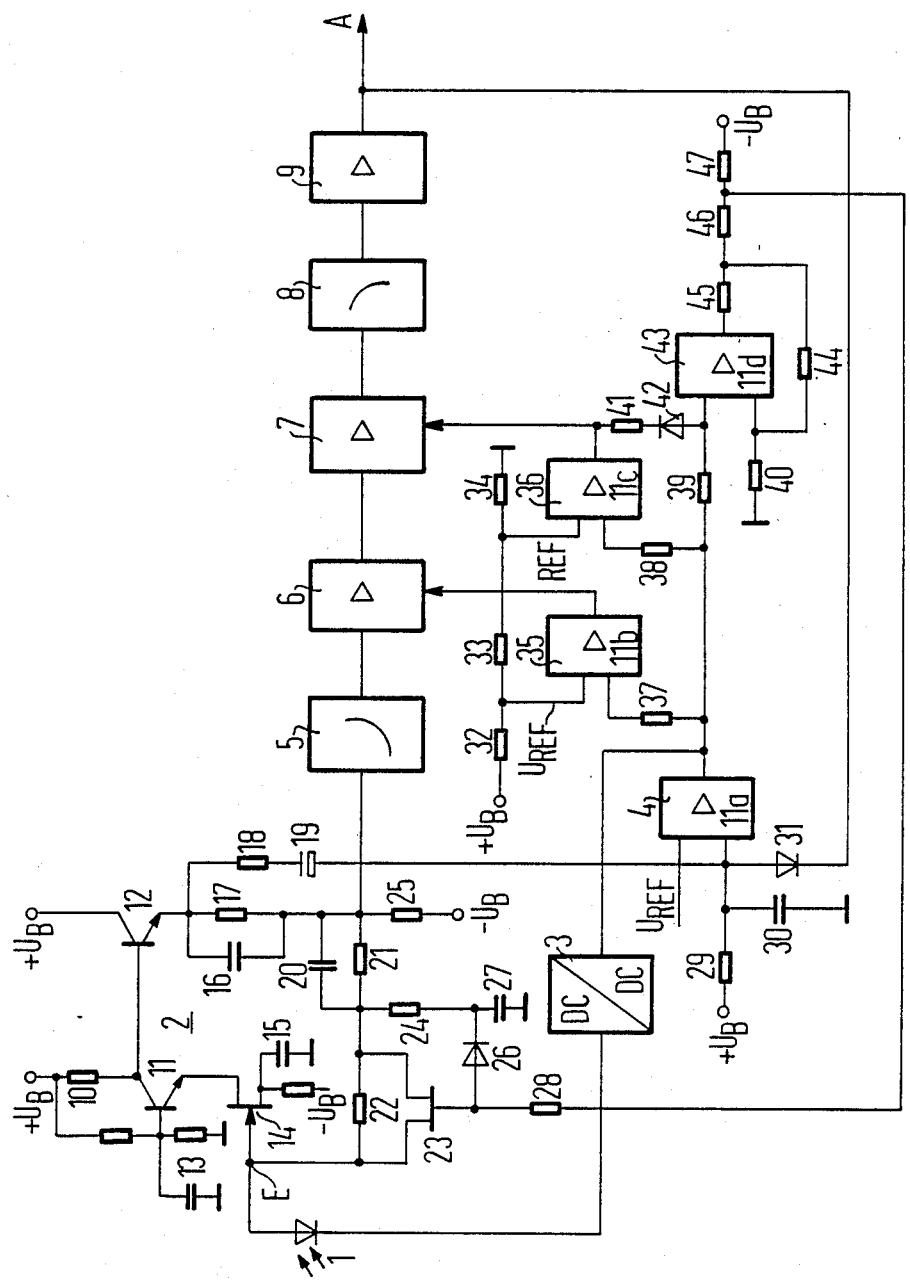

CIRCUIT ARRANGEMENT HAVING A PRE-AMPLIFIER CONNECTED TO AN OPTO-ELECTRIC TRANSDUCER

BACKGROUND OF THE INVENTION

The present invention is directed to a circuit arrangement having a pre-amplifier connected to an optoelectric transducer whose gain is controllable by a final control element formed by a field effect transistor.

Such a circuit arrangement is disclosed by German Pat. No. 32 04 839.

At its input, the prior art circuit arrangement has a photodiode and contains an iterative circuit composed of an emitter stage and a collector stage. A resistor in a feedback branch is arranged between the output of the collector stage and the input of the emitter stage. This circuit arrangement composed of two stages forms what is referred as a transimpedance amplifier that has a relatively low input resistance and an extremely low output resistance. The drain-source path of a field effect transistor whose resistance is continuously controllable by a control voltage is in parallel to the collector resistor of the emitter stage. The effective collector resistance can be varied within broad limits in this manner. As a result an external setting of the gain of the first amplifier stage within a relatively great dynamic range is possible.

The prior art circuit arrangement should also exhibit the usual requirements of optimum signal to noise ratio of the electrical signals emitted by the photoreceiver, high gain and low power consumption together with an optimally low set noise.

SUMMARY OF THE INVENTION

It is an object to the present invention to provide a circuit arrangement of the type initially cited such that the gain has an especially great range of dynamics and such that there is only a slight variation of the frequency response of the circuit arrangement. In particular, a faultless operation is guaranteed even for discontinuities in a light level that produces an overdriving of the pre-amplifier.

In accordance with the present invention, the circuit arrangement for achieving the stated object has a controllable amplifier arrangement containing at least one amplifier arrangement having at least one amplifier controllable with respect to its gain that is arranged iteratively relative to the pre-amplifier and which is controllable by a regulator whose actual value input is connected to an actual value generator connected to an output (A) of the circuit arrangement and which is connected to an output circuit of the pre-amplifier via a differentiating element. The pre-amplifier contains a series circuit of two resistors in a feedback branch. The field effect transistor forms the final control element and has its drain-source path connected in parallel to one of the resistors of the series circuit and is controllable by a hysteresis-affected on/off control circuit that is also connected to the regulator. The control circuit of the field effect transistor is inhibited in a first switch state and the control circuit is conductive in a second switch state. The on/off control circuit is controllable by the regulator such that it switches from the first into the second switch state when the controllable amplifier arrangement at least approximately reaches the condition of minimum gain for increasing input level of the circuit arrangement. The gain of the pre-amplifier is thereby automatically switched, whereby unnecessary switch events are avoided. In combination with the control of the variable amplifier arrangement by the regulator, this switching provides the advantages that the full dynamic range of the circuit arrangement is achieved by a double utilization of the range of regulation of the controllable amplifier arrangement. Both slow level changes as well as level skips are evened out by the regulator contained in the circuit arrangement. The increased dynamic range can be easily dimensioned in an advantageous way such that a short-circuit operation with a laser transmitter is also possible.

The pre-amplifier whose feedback is switchable by the field effect transistor serving as a final control element can be fashioned as follows. The pre-amplifier contains a first transistor whose collector is connected to a first supply voltage ($+U_B$) via a resistor and contains a second transistor in collector-base circuitry. The base of the second transistor is connected to the collector of the first transistor and the feedback branch is connected to the emitter circuit of the second transistor. The structure as a transimpedance amplifier is disclosed by German Pat. No. 32 04 839. The particular advantage is that the field effect transistor serving as a final control element is operated as a switch and thus guarantees especially reliable switch states for the switching function.

An especially advantageous embodiment with respect to the transimpedance amplifier is in the circuit arrangement wherein a controlled path of a further transistor is connected between the emitter of the first transistor and a reference potential. The feedback branch and the opto-electric transducer are connected to the control of the further transistor. A field effect transistor preferably serves as the further transistor. The low input capacitance of the field effect transistor advantageously allows an especially high-impedance formation of the feedback branch. Moreover, the field effect transistor provides low noise for high amplification.

In a further circuit arrangement the actual value input of the regulator is connected to the emitter of the second transistor via a RC series circuit. The output of the pre-amplifier is formed by the junction of two resistors whose series circuit forms the emitter circuit. A capacitor is connected in parallel to the resistor of the series circuit that is connected between the emitter of the second transistor and the output of the pre-amplifier. The measures according to this circuit arrangement have the advantage that the dc operating point can be set with the assistance of a voltage divider independently of the ac voltage properties of the amplifier and that the differentiating element is thereby fed from a low-impedance voltage source.

Another further circuit arrangement has a high-pass filter connected between the pre-amplifier and the controllable amplifier arrangement and a low-pass filter connected between the controllable amplifier arrangement and the output (A) of the circuit arrangement. In the improvement of this circuit arrangement the high-pass filter expediently cancels the low-pass-like frequency response of the pre-amplifier. The desired frequency response of the circuit arrangement is defined by the low-pass filter following the controllable amplifier arrangement.

A further development of the invention is a circuit arrangement wherein a diode polarized in a conducting direction for control voltages that activate the field effect transistor forming the final control element is connected in parallel to the control path of the field effect transistor. This advantageously allows especially great tolerances to be admitted for the two potentials to which the control path of the field effect transistor forming the final control element is connected.

In a further circuit arrangement the junction of the resistors of the feedback branch is connected to a reference potential via a R-C series circuit. A capacitor is connected in parallel to the resistor of the feedback branch that remains effective when the field effect transistor of the final control element is conductive. The improvement of the invention according this circuit arrangement advantageously allows natural oscillations of the pre-amplifier to be reliably suppressed and to thereby assure that the frequency response of the pre-amplifier is practically the same in both switch states of the field effect transistor serving as the final control element.

The measures of a circuit arrangement wherein the diode is connected between a control electrode of the field effect transistor of the final control element and the junction between the resistor and the capacitor for the RC series circuit have the advantage that the insertion of the diode has no influence on the stability of the pre-amplifier.

Given the embodiment of the amplifier arrangement wherein the opto-electric transducer is connected to a dc voltage converter which is connected to the output of the regulator the opto-electric transducer, the pre-amplifier and the controllable amplifier arrangement are incorporated into the dynamics regulation in an advantageous way.

Finally, in a further circuit arrangement the controllable amplifier is controllable by a differential amplifier connected to the regulator. The control input of the on/off control circuit is connected to the output of the regulator via a resistor and is also connected to the output of the differential amplifier via a circuit path containing a diode and a resistor connected in series with the diode. The diode is polarized such that it is inhibited for output voltages of the differential amplifier that lie within the range of control of the controllable amplifier. This circuit arrangement has the advantage that a differentiating amplifier provided for driving a controllable amplifier is simultaneously utilized for accelerated drive of the hysteresis-affected on/off control circuit. The fast switching produced as a result thereof has the advantage of a limitation of bit errors of the transmitted signals.

BRIEF DESCRIPTION OF THE DRAWING

The features of the present invention which are believed to be novel, are set forth with particularity in the appended claims. The invention, together with further objects and advantages, may best be understood by reference to the following description taken in conjunction with the accompanying drawing, and in which:

The single figure shows a circuit arrangement having a per-amplifier connected to an opto-electric transducer and a controllable amplifier arrangement iteratively connected therewith.

DESCRIPTION OF THE PREFERRED EMBODIMENT

The circuit arrangement shown in the figure contains a pre-amplifier 2 that is connected to a photodiode 1, particularly to an avalanche diode. The pre-amplifier 2, in turn, contains a first bipolar transistor 11, a second bipolar transistor 12 and a field effect transistor 14. In the first transistor 11, the base is connected to a reference potential via a capacitor 13, the collector is connected to a supply voltage $+U_B$ via a resistor 10 and the emitter is connected to a drain electrode of the field effect transistor 14. In the field effect transistor 14, the source electrode is connected to ground via a capacitor 15, i.e. for alternating voltages. The control electrode of the field effect transistor 14 is connected to the anode of the photodiode 1.

The second transistor 12 has its base connected to the collector of the first transistor 11 and has its collector connected to the supply voltage $+U_B$. The transistor 12, connected as emitter follower, has its emitter connected to a supply voltage $-U_B$ via an R-C parallel circuit composed of resistor 17 and capacitor 16 and via a resistor 25 lying in series therewith. The junction between the resistors 17 and 25 forms the output of the pre-amplifier 2 that is connected to the input of the high-pass filter 5 and is connected to the control electrode of the field effect transistor 14 via the feedback branch composed of resistors 21 and 22.

The source/drain path of the field effect transistor 23, serving as a final control element, is in parallel to the resistor 22. The drain electrode of the field effect transistor 23 is connected to the control electrode of the field effect transistor 14. The series circuit composed of diode 26 and resistor 24 is connected between the control electrode and the source electrode of the field effect transistor 23. This series circuit is in parallel to the control path of the field effect transistor 23. The diode 26 is polarized such that it is operated in a conducting direction for control voltages that activate the field effect transistor 23. The junction of diode 26 and resistor 24 is connected to ground via capacitor 27. The capacitor 20 is connected in parallel to the resistor 21.

The high-pass filter 5 connected to the output of the pre-amplifier 2 is followed by an iterative circuit that is composed of controlled amplifier 6, of controlled amplifier 7, of low-pass filter 8 and of final amplifier 9.

The control input of the controllable amplifier 6 is preceded by the differential amplifier 35; the control input of the controllable amplifier 7 is preceded by the differential amplifier 36. The differential amplifiers 35 and 36 have their reference voltage inputs connected to taps of the voltage divider composed of resistors 32, 33 and 34. In this voltage divider, the resistor 32 is connected to the supply voltage $+U_B$ and the resistor 34 is connected to the reference potential. The reference voltage input of the differential amplifier 35 is connected to the junction between the resistors 32 and 33; the reference voltage input of the differential amplifier 36 is connected to the junction between the resistors 33 and 34. The reference voltage of the differential amplifier 35 is therefore greater than that of the differential amplifier 36.

The actual value input of the differential amplifier 35 is connected to the output of a regulator 4 via resistor 37 and the actual value input of the differential amplifier 36 is connected to the output of the regulator 4 via resistor 38. The input of dc converter 3 whose output is connected to the cathode of the photodiode 1 also is connected to the output of the regulator 4. Finally, the control input of on/off control circuit 43 is connected to the output of the regulator 4 via resistor 39.

The output of the differential amplifier 36 is also connected to the control input of the on/off control circuit 43 via the series circuit composed of resistor 41 and of diode 42. The diode 42 is polarized such that it is inhibited for output voltages of the differential amplifier 36 as provided for the range of control of the controllable amplifier 7.

The on/off control circuit 43 is formed by a feedback differential amplifier. In this differential amplifier, a further input is connected to the reference potential or to ground via the resistor 40. The output of the on/off control circuit 43 is connected to the supply voltage $-U_B$ via the series circuit composed of resistors 45, 46 and 47. The junction of the resistors 45 and 46 is connected to the further input of the differential amplifier 43 via the resistor 44 the junction of the resistors 46 and 47 is connected to the control electrode of the field effect transistor 23 serving as the final control element, being connected thereto via the resistor 28.

The regulator 4 has its reference voltage input connected to a reference voltage $U_{Ref}$. The actual value input of the regulator 4 is connected to the output of the circuit arrangement via diode 31 and is connected to the reference potential via capacitor 30 and is connected to the supply voltage $+U_B$ via resistor 29.

The optical signal incoming at the input E is converted into an electrical signal in the avalanche photodiode 1 and is supplied to the pre-amplifier of low-noise transimpedance amplifier 2.

The supply voltage for the photodiode 1 is supplied by the dc converter 3 that is controlled by the regulator 4 serving the purpose of automatic gain control.

The gain-defining feedback of the transimpedance amplifier is essentially composed of the two resistors 21 and 22 wherein the resistor 22 can be shorted via the source-drain path of the field effect transistor 23 for appropriate gate drive by the control. As a result the gain is lowered, for example, by about 40 dB.

The following equalizer high-pass filter 5 cancels the frequency response of the pre-amplifier 2. The two controllable amplifiers 6 and 7 follow and have a frequency-independent range of gain control which amounts, for example, to about 20 dB each. The controllable amplifiers 6 and 7, in particular, are each fashioned as a two-stage, broadband amplifier.

Before the signal is amplified again in the output stage, in the final amplifier 9, a band limitation occurs in the low-pass filter 8. This low-pass filter 8 is preferably a Gaussian low-pass filter free of phase distortion.

The signal amplitude at the output A of the amplifier arrangement or of the optical receiver is kept constant via the gain control.

Proceeding from the maximum, overall amplification for a correspondingly small input signal, only the gain factor M of the photodiode 1 is decreased by reducing the bias voltage for an increase of the input level. At the end of the range of control of the photodiode 1, particularly as soon as the gain factor M of the photodiode 1 reaches roughly the value 1, the first controllable amplifier 6 begins with the downward control. This particularly occurs by reducing the PIN diode current of the PIN diode serving as the final control element controlled by the differential amplifier 35. When it has arrived at the lower end of the range of control, the second amplifier 7 is recontrolled. For further level intensification, the switching of the pre-amplifier 2 occurs at the end thereof by shorting the feedback resistor 22 via the switching field effect transistor 23. The resulting drop in gain is in turn compensation for by upward control of the two controlled amplifiers 6 and 7. A further gain intensification up to the maximally allowable input level leads to the same downward control as set forth above.

In the circuit arrangement shown in the Figure, the feedback resistance of the pre-amplifier 2 fashioned as a transimpedance amplifier is divided into the two resistors 21 and 22. One of these resistors, namely the resistor 22, can be shorted via the source-drain path of the field effect transistor 23. The field effect transistor is driven to high-impedance or low-impedance via the on/off control circuit 43. The gain of the amplifier 2 can thus be lowered, for example, by 40 dB.

This switching advantageously leads to a significant increase in the range of control circuits. The results from the fact that the existing control circuits of the two following amplifiers 6 and 7 are doubly utilized. If the increase in the dynamic range by, for example, 20 dB with reference to the light level were realized with a continuous control in the pre-amplifier 2, the, due to the proportionality between light power and photocurrent, an increase in the range of control of the amplification by 40 dB would be required. For example, two additional control circuits would be required for this purpose.

For a preferred embodiment of the circuit arrangement, the optical signals received by the photodiode are light pulses of PCM signals that, for example, are transmitted with a transmission rate of 34 Mbit/s. In this case, a decision stage is provided at the output A. Roughly the same current pattern should thereby be available at the decision stage in both switch states of the field effect transistor 23. This means that the frequency responses that the pre-amplifier 2 has in the two switch stages of the field effect transistor 23 should be identical.

If the limit frequencies of the high-impedance and of the low-impedance feedback dipole were dimensioned identically without the capacitor 27, whereby the limit frequency of the high-impedance feedback dipole is formed only by the parasitic capacitance, then the frequency responses of the two switch states would be theoretically identical. As a result of the comparatively high gain in the feedback loop, however, natural oscillations could potentially arise. The limit frequency of the low-impedance dipole is therefore expediently selected higher and the capacitor 27 is cross-connected for adaptation of the frequency response for activation of the high-impedance dipole. This capacitor 27 has no influence on the frequency response of the pre-amplifier 2 when the feedback resistor 22 is shorted since it is connected in parallel to a very low-impedance circuit point. The series-connected, low-impedance resistor 24 damps the peaking for series resonance.

The "conductive" or "non-conductive" operating states of the field effect transistor 23 are set by appropriate gate-source voltages. The relatively narrow range of gate-source voltage that is available for the "conductive" state could not be set with the required reliability without further control with a fixed gate voltage since the source voltage is subject to fluctuations dependent on the light level. These difficulties are avoided in that the required gate-source voltage that lies in the range from $+0.5V$ through $-0.8V$ is generated by the throughput voltage of the Schottky diode 26. The diode 26 is driven conductive via the drop resistor 28 of the liberally tolerated switching voltage of the drop resistor 28 of the liberally tolerated switching voltage of the on/off control circuit 43. The gate-source voltage of the field effect transistor 23 thus becomes independent of the fluctuations of the source voltage of the field effect transistor or of the voltage of the on/off control circuit 43, being always set to about 0.3V. The "non-conductive" switch state is realized with a fixed gate voltage that is derived from the supply voltage $-U_B$ by the voltage divider composed of the resistors 45, 46 and 47. This is possible because of the available range of gate-source voltage. The diode 26 is thereby inhibited.

Special demands are made of the circuit arrangement when high light levels are quickly switched on after the pre-amplifier had been previously set to a high gain as a consequence of a low or absent light power. In this case, the pre-amplifier is overdriven, so that, without special measures, the control for leveling back the following amplifiers 6 and 7 and for subsequent switching of the pre-amplifier 2 to low gain would not receive the proper information. A loss of the data signal transmission would be the consequence.

For slow changes in the input level in comparison to the recovery time constant, this problem does not arise since the pre-amplifier 2 is switched by the on/off control circuit 43 before the beginning of the overdrive condition.

Since the emitter voltage of the transistor 12 is modified by about 1 to 3V in the direction of the supply voltage $-U_B$ dependent on the overdrive of the pre-amplifier 2, this criterion is supplied to the input of the regulator 4 as a second regulating variable. If the emitter voltage of the transistor 12 were connected to the input of the regulator 4 only via the decoupling resistor 18, then discrete changes in the operating point of the transistor 12 would have effects on the signal amplitude at the decision stage that is to be kept constant if this were not prevented with a separate balancing. Modifications of the signal amplitude that are caused by small shifts of the operating point of the transistor 12 in the entire range of light level, by contrast, cannot be balanced. The resistor 18 and the capacitor 19 are connected in series between the output (emitter of transistor 12) of the pre-amplifier 2 and the input of the regulator 4, and forms a differentiating element.

The capacitor 19, however, interrupts the dc connection between the emitter of the transistor 12 and the input of the regulator 4. Only discontinuous elevations of light level that overdrive the pre-amplifier 2 thus lead to an influencing of the control circuit. The capacitance of the capacitor 19 of, for example, 6.8 $\mu$F is expediently selected such that the time constant of the R-C series circuit 19, 29 is greater than the recovery time constant of the control circuit.

The pre-amplifier 2 is generally switched during operation only in exceptional cases. It is nonetheless desirable to keep bit errors during the switching time as slight as possible. When the light level at which the second controlled amplifier 7 has just arrived at the lower end of its range of control is slowly further intensified, then the output voltage at the operational amplifier 36 drops quickly toward minus potential or in the direction of the supply voltage $-U_B$. The diode 42 becomes conductive and drives the on/off control circuit 43 to positive output voltage. The field effect transistor 23 is switched into its "conductive" condition via the voltage divider composed of the resistors 46 and 47 and the drop resistor 28 and the Schottky diode 26. The switching is also without resistor 41 or without the diode 42. The switching event, however, is advantageously greatly accelerated by use of the resistor 41 and of the diode 42 by exploiting the gain of the operational amplifier 36.

When the optical receiver or the amplifier arrangement is operated with a light level that lies in the region of the switching of the pre-amplifier, then ordinary level fluctuations do not effect any switchings. This is achieved in that the on/off control circuit 43 is equipped with a hysteresis. A correspondingly different reference voltage is set by the resistors 40, 44 and 45 in both switch states of the on/off control circuit 43. The hysteresis is set to the design value by a suitable selection of the resistors 40 and 44.

The invention is not limited to the particular details of the apparatus depicted and other modifications and applications are contemplated. Certain other changes may be made in the above described apparatus without departing from the true spirit and scope of the invention herein involved. It is intended, therefore, that the subject matter in the above depiction shall be interpreted as illustrative and not in a limiting sense.

What is claimed is:

1. A circuit arrangement having a pre-amplifier having its input (E) connected to an optoelectric transducer whose gain is controllable by a final control element formed by a field effect transistor, comprising:

a controllable amplifier arrangement containing at least one amplifier arrangement having at least one amplifier controllable with respect to its gain that is arranged iteratively relative to the pre-amplifier and which is controllable by a regulator whose actual value input is connected to an actual value generator connected to an output (A) of the circuit arrangement and which is connected to an output circuit of the pre-amplifier via a differentiating element;

the pre-amplifier containing a series circuit of two resistors in a feedback branch;

the field effect transistor forming the final control element and having its drain-source path connected in parallel to one of the resistors of the series circuit and being controllable by a hysteresis-affected on/-off control circuit that is also connected to the regulator such that the control circuit of the field effect transistor is inhibited in a first switch state and the control circuit is conductive in a second switch state;

the on/off control circuit being controllable by the regulator such that it switches from the first into the second switch state when the controllable amplifier arrangement at least approximately reaches the conditions of minimum gain for increasing input level of the circuit arrangement.

2. The circuit arrangement according to claim 1, wherein the pre-amplifier contains a first transistor whose collector is connected to a first supply voltage ($+U_B$) via a resistor and contains a second transistor connected as an emitter follower; and wherein the base of the second transistor is connected to the collector of the first transistor; and wherein the feedback branch is connected to the emitter circuit of the second transistor.

3. The circuit arrangement according to claim 2, wherein a controlled path of a further transistor is connected between the emitter of the first transistor and a reference potential; and wherein the feedback branch and the opto-electric transducer are connected to a gate of the further transistor.

4. The circuit arrangement according to claim 2 wherein the actual value input of the regulator is connected to the emitter of the second transistor via a RC series circuit; and wherein the output of the pre-amplifier is formed by the junction of two resistors whose series circuit forms the emitter circuit; and wherein a capacitor is connected in parallel to the resistor of the series circuit that is connected between the emitter of the second transistor and the output of the pre-amplifier.

5. The circuit arrangement according to claim 1 wherein a high-pass filter is connected between the pre-amplifier and the controllable amplifier arrangement and a low-pass filter is connected between the controllable amplifier arrangement and the output (A) of the circuit arrangement.

6. The circuit arrangement according to claim 1 wherein a diode polarized in a conducting direction for control voltages that activate the field effect transistor forming the final control element is connected in parallel to a gate and a source of the field effect transistor.

7. The circuit arrangement according to claim 1 wherein the junction of the resistors of the feedback branch is connected to a reference potential via a R-C series circuit; and wherein a capacitor is connected in parallel to the resistor of the feedback branch that remains effective when the field effect transistor of the final control element is conductive.

8. The circuit arrangement according to claim 7, wherein a diode is connected between a control electrode of the field effect transistor of the final control element and the junction between a resistor and a capacitor of the R-C series circuit.

9. The circuit arrangement according to claim 1, wherein the opto-electric transducer is connected to a dc voltage converter which is connected to an output of the regulator.

10. The circuit arrangement according to claim 1 wherein the controllable amplifier is controllable by a differential amplifier connected to the regulator; and wherein the control input of the on/off control circuit is connected to the output of the regulator via a resistor and is also connected to the output of the differential amplifier via a circuit path containing a diode and a resistor connected in series with the diode; and wherein the diode is polarized such that it is inhibited for output voltages of the differential amplifier that lie within the range of control of the controllable amplifier.

11. A circuit arrangement having a pre-amplifier having its input (E) connected to an opto-electric transducer whose gain is controllable by a final control element formed by a field effect transistor, comprising:
a controllable amplifier arrangement having at least one amplifier controllable with respect to its gain that has a circuit input connected to an output of the pre-amplifier and which is controllable by a regulator having at least an actual value input connected to an actual value generator connected to an output (A) of the circuit arrangement, the amplifier having a control input connected to an output of the regulator via a differential amplifier;
the pre-amplifier containing a series circuit of two resistors in a feedback branch;
the field effect transistor forming the final control element and having its drain-source path connected in parallel to one of the resistors of the series circuit and being controllable by a hysteresis-affected on-/off control circuit that has a control input connected to the output of the regulator such that the control circuit of the field effect transistor is inhibited in a first switch state and the control circuit is conductive in a second switch state, the control circuit having on output connected to a gate of said field effect transistor;
the on/off control circuit being controllable by the regulator such that it switches from the first into the second switch state when the controllable amplifier arrangement at least approximately reaches the condition of minimum gain for increasing input level of the circuit arrangement.

12. The circuit arrangement to claim 11, wherein the pre-amplifier contains a first transistor whose collector is connected to a first supply voltage ($+U_B$) via a resistor and contains a second transistor connected as an emitter follower; and wherein the base of the second transistor is connected to the collector of the first transistor; and wherein the feedback branch is connected to the emitter circuit of the second transistor.

13. The circuit arrangement according to claim 12, wherein a controlled path of a further transistor is connected between the emitter of the first transistor and a reference potential; and wherein the feedback branch and the opto-electric transducer are connected to a gate of the further transistor.

14. The circuit arrangement according to claim 12 wherein the actual value input of the regulator is connected to the emitter of the second transistor via a RC series circuit; and wherein the output of the pre-amplifier is formed by the junction of two resistors whose series circuit forms the emitter circuit; and wherein a capacitor is connected in parallel to the resistor of the series circuit that is connected between the emitter of the second transistor and the output of the pre-amplifier.

15. The circuit arrangement according to claim 11 wherein a high-pass filter is connected between the output of the pre-amplifier and the input of the controllable amplifier and a low-pass filter is connected between an output of the controllable amplifier and the output (A) of the circuit arrangement.

16. The circuit arrangement according to claim 11, wherein a diode polarized in a conducting direction for control voltages that activate the field effect transistor forming the final control element is connected in parallel to a gate and a source of the field effect transistor.

17. The circuit arrangement according to claim 11 wherein the junction of the resistors of the feedback branch is connected to a reference potential via a R-C series circuit; and wherein a capacitor is connected in parallel to the resistor of the feedback branch that remains effective when the field effect transistor of the final control element is conductive.

18. The circuit arrangement according to claim 17, wherein a diode is connected between a control electrode of the field effect transistor of the final control element and the junction between a resistor and a capacitor of the R-C series circuit.

19. The circuit arrangement according to claim 11 wherein the opto-electric transducer is connected to a dc voltage converter which is connected to the output of the regulator.

20. The circuit arrangement according to claim 11 wherein the controllable amplifier is controllable by a differential amplifier connected to the regulator; and wherein the control input of the on/off control circuit is connected to the output of the regulator via a resistor and is also connected to the output of the differential amplifier via a circuit path containing a diode and a resistor connected in series with the diode; and wherein the diode is polarized such that it is inhibited for output voltages of the differential amplifier that lie within the range of control of the controllable amplifier.

* * * * *